United States Patent [19]
Parish et al.

[11] Patent Number: 4,769,618
[45] Date of Patent: Sep. 6, 1988

[54] DISTRIBUTED POWER COMBINER/DIVIDER

[75] Inventors: Robert M. Parish, Hermosa Beach; Albert F. Lawrence, IV, Redondo Beach, both of Calif.

[73] Assignee: TRW Inc., Redondo Beach, Calif.

[21] Appl. No.: 869,166

[22] Filed: May 30, 1986

Related U.S. Application Data

[63] Continuation-in-part of Ser. No. 868,861, May 30, 1986, abandoned.

[51] Int. Cl.[4] .................... H03F 3/16; H03H 11/36
[52] U.S. Cl. ..................................... 330/277; 330/54; 330/286; 333/100; 333/127
[58] Field of Search ............... 333/100, 124, 127, 128, 333/136; 330/54, 277, 286

[56] References Cited

U.S. PATENT DOCUMENTS

| | | | |
|---|---|---|---|
| 2,914,737 | 11/1959 | Tongue | 333/124 |
| 3,176,237 | 3/1965 | Liger | 330/54 X |
| 4,423,386 | 12/1983 | Gerard | 330/54 |
| 4,543,535 | 9/1985 | Avasli | 330/277 X |
| 4,564,817 | 1/1986 | Gilson et al. | 330/54 X |
| 4,668,920 | 5/1987 | Jones | 330/277 X |
| 4,675,911 | 6/1987 | Sokolov et al. | 330/54 X |

OTHER PUBLICATIONS

Tyminski, "Wide-Band Chain Amplifier for TV", Radio and Television News, vol. 43, No. 4, pp. 14–16, 29, Apr. 1950.

*Primary Examiner*—Paul Gensler
*Attorney, Agent, or Firm*—Noel F. Heal; Sol L. Goldstein

[57] ABSTRACT

A radio-frequency (rf) power combiner or divider structure containing distributed amplifier components and having broadband operating characteristics, and operable with net gain or practically no insertion losses. The divider structure includes an input transmission line having series-connected impedances that interconnect with active devices, such as field-effect transistors to form a practically lossless line. The active devices provide gain between distributed points in the input transmission line and distributed points in multiple output transmission lines, which are similarly structured as series-connected impedances. Each output transmission line supplies one of the divider outputs. In the combiner form of the device, there is a single output transmission line and multiple input transmission lines, coupled to the output line in a distributed manner by active devices.

8 Claims, 1 Drawing Sheet

DISTRIBUTED POWER COMBINER/DIVIDER

This application is a continuation-in-part of an application having Ser. No. 868,861, filed on May 30, 1986, and now abandoned.

BACKGROUND OF THE INVENTION

This invention relates generally to circuitry for combining or dividing power and, more particularly, to power combiners and dividers used in communication systems at microwave frequencies.

The conventional technique for dividing power in communication system is to employ passive electrical networks, such as Wilkinson dividers, each of which produces two nominally equal outputs from a signal input. Such networks can be cascaded to produce larger numbers of output ports from a single input. In this specification, operation will be described first in terms of power dividing, but it will be understood that each circuit described can be operated in an inverse manner to perform a power combining function.

In cascaded passive networks of the Wilkinson type, there is a substantial loss of energy from one stage to the next, and the size and weight of the network are dependent on the divide ratio (N) and the frequency of operation. In systems requiring power division over a wide band of frequencies, involving multiple octaves, the use of large N-way dividers can limit system performance due to high insertion loss, and large size and weight.

Ideally, what is needed for use in microwave communication systems is a power divider and combiner that is small in size, light in weight, has low insertion loss, and is capable of providing a high divide ratio over a wide frequency band. The present invention is directed to this end.

SUMMARY OF THE INVENTION

The present invention resides in a power divider/combiner structure that employs a distributed approach to power division or combination. Basically, and in general terms, the structure of the invention comprises a first transmission line having a plurality of lumped impedances connected together to form a practically lossless line of which one end is an input/output terminal, a plurality (N) of additional transmission lines, each having a plurality of connected impedances and providing an input/output terminal, and a plurality of active devices connected between junction points in the first transmission line and junction points in the additional transmission lines.

In the divider form of the invention, the first transmission line is an input line, the additional transmission lines are output lines, and the active devices are input terminals coupled to the input line and output terminals coupled to the output lines. In the combiner form of the invention, the first transmission line is an output line, the additional transmission lines are input lines, and the active devices have input terminals coupled to the input lines and output terminals coupled to the output line.

More specifically, the power divider of the invention includes an input transmission line having a plurality of series-connected impedances, an input terminal at one end of the line, and a terminating impedance connected between the other end of the line and ground. The divider also includes a plurality of active devices, each having an input terminal and an output terminal, the input terminals of the active devices being connected to junction points between impedances in the input transmission line; and a plurality (N) of output transmission lines, where N is the divide ratio of the power divider, each output transmission line having a plurality of series-connected impedances. One end of each output transmission line provides an output terminal, and the other end is connected to ground through a terminating impedance. The output terminals of a plurality of the active devices are connected to junctions between impedances in each output transmission line.

In a practical embodiment of the divider and combiner, the impedances in the input transmission line and in the output transmission lines function in combination with internal capacitances of the active devices, to produce a desired characteristic transmission line impedance. In the illustrative embodiment, the active devices are field-effect transistors, each having a gate terminal, a source terminal and a drain terminal. The gate terminals are connected to junctions between impedances in the input transmission line, the drain terminals are connected to junctions between the impedances in the output transmission lines, and the source terminals are grounded.

The combiner form of the invention includes an output transmission line having a plurality of series-connected impedances, an output terminal at one end of the line, and a terminating impedance connected between the other end of the line and ground; and a plurality of active devices, each having an input terminal and an output terminal, the output terminals of the active devices being connected to junction points between impedances in the output transmission line. The combiner further includes a plurality (N) of input transmission lines, where N is the divide ratio of the power combiner, each input transmission line having a plurality of series-connected impedances. One end of each input transmission line provides an input terminal, the other end is connected to ground through a terminating impedance, and the input terminals of a plurality of the active devices are connected to junctions between the impedances in the input transmission line.

It will be appreciated from the foregoing that the present invention represents a significant advance in the field of rf power dividers and combiners. In particular, the structure of the invention permits power dividing or combining with extremely low losses, and with operating characteristics that do not vary significantly with the divide ratio or with the frequency of operation. In addition, the structure of the invention is extremely compact and light in weight. Other aspects and advantages of the invention will become apparent from the following more detailed description, taken in conjunction with the accompanying drawings.

DESCRIPTION OF THE PREFERRED EMBODIMENTS

Figure 1:
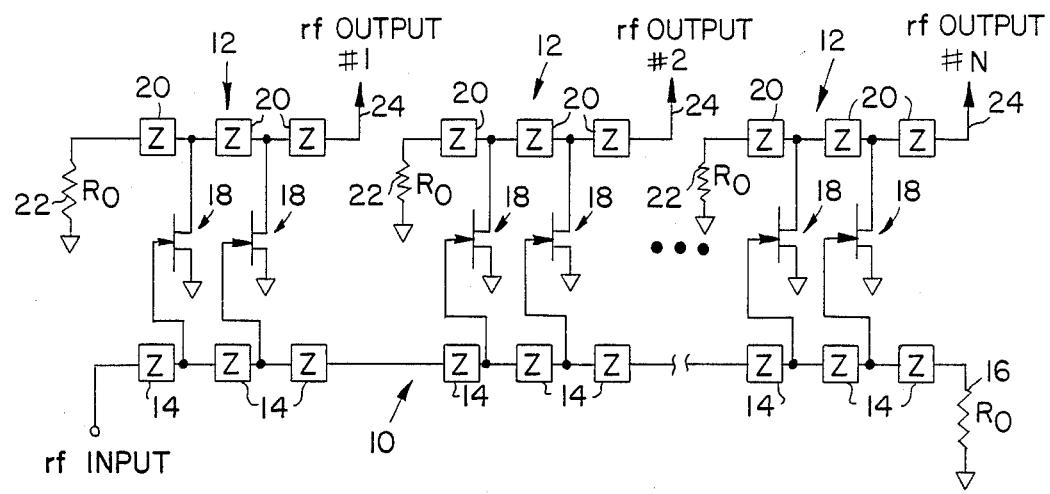
FIG. 1 is schematic diagram of a distributed power divider in accordance with the invention.

As shown in the drawings for purposes of illustration, the present invention is concerned with power divider and combiner structures, particularly those used in microwave communication systems. Passive networks for power division and combination suffer from relatively high losses and have performance characteristics that are highly dependent on the divide ratio (N) and the frequency of operation.

In accordance with the invention, power division and combination are effected in a distributed manner that permits large divide ratios with extremely low losses, with operation over a wide band of frequencies. As shown in FIG. 1, the distributed power divider of the invention includes an input transmission line, indicated by reference numeral 10, and a plurality (N) of output transmission lines 13, where N is the divide ratio of the power divider. The input transmission line 10 is characterized by a "characteristic impedance" $R_0$. The line 10 consists of a plurality of series-connected impedances Z, indicated at 14. In practice, and as will become apparent as this description proceeds, the series-connected impedances 14 which constitute line 10 are connected to other devices that have parasitic impedances associated with them. Accordingly, the impedances 14 are selected such that, when combined with these parasitic impedances, and transmission line 10 has the desired characteristic impedance $R_0$. This may require different impedance values for the various impedance elements 14.

As is well known in transmission line theory, a transmission line of infinite or very large length has a characteristic electrical impedance as "viewed" from one end of the line. Such a line has truly distributed parameters. Its resistance, inductance, and its capacitance to ground are distributed uniformly along its length. The characteristic impedance can be calculated from the electrical properties of the line. Moreover, a line of finite length will behave in the same manner as such a theoretically infinite line if the finite line is "terminated" by its own characteristic impedance, i.e., when the remote end of the line is connected to ground through an impedance approximately equal to the characteristic impedance.

The multiple impedances Z 14 in the input transmission line 10 may take the form of transmission line sections with distributed impedances, or may take the form of lumped impedances. The input transmission line 10 is terminated by an impedance $R_0$, indicated at 16, and is theoretically loss free, the junction points between the impedances 14 being practically equivalent to each other except for phase differences along the line.

The power divider of the invention further includes multiple active devices 18, which, in the illustrative embodiment of the invention, are field-effect transistors (FETs). Each FET gate terminal is connected to a different junction point between adjacent impedances 14. Each source terminal of the FETs 18 is grounded, and each drain terminal provides an output signal that is coupled to one of the output transmission lines 12. In the illustrative embodiment of the divider, each output transmission line 12 consists of three series-connected impedances 20 and of a terminating resistor 22 of value $R_0$. The two junction points between the first and second and the second and third impedances 20 have connected to them the drain terminals of two adjacent FETs 18, and each output transmission line 12 provides an output at one end, as indicated at 24. As described above with respect to the input line 10, the values of the impedances 20 within each output line 12 are selected so that, in combination with the parasitic impedances associated therewith, they constitute an output transmission line 12 having the desired characteristic impedance $R_0$.

A common requirement is for equal power division among N outputs, in which case the active devices 18 must be identical. However, non-identical active devices can be employed to provide a desired, non-uniform division of power. Another technique for obtaining non-uniform power distribution is to vary the number of active devices 18 contributing to each output line 12. For example, the illustrative embodiment has two active devices 18 contributing power to each output line 12. If one of the output lines were to have three active devices connected to it, this output line would have fifty percent more power than the others with only two active devices. This assumes, of course, that the active devices are identical. Another possibility is that the input and output transmission lines can be designed to have different characteristic impedances, for further design flexibility.

The distributed approach of the invention provides broadband performance characteristics, with dividers capable of operation over multiple octaves of frequency range. The use of distributed active components provides a dramatic improvement over the large insertion losses associated with passive networks for power division, accompanied by a huge reduction in size and weight. The circuits of the invention can be conveniently fabricated as Microwave Integrated Circuits (MICs) or as Monolithic Microwave Integrated Circuits (MMICs) using silicon or gallium arsenide technologies.

Figure 2:
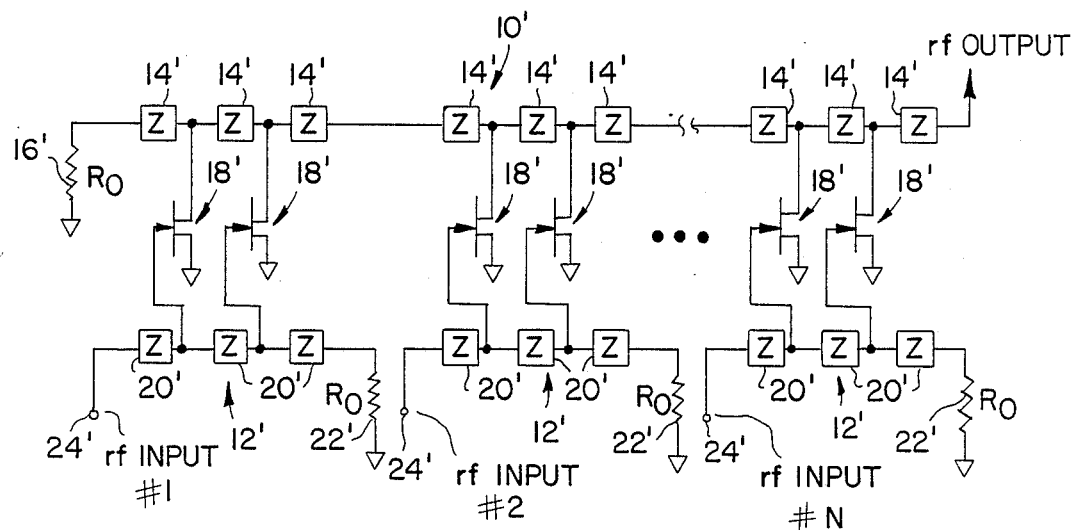
FIG. 2 is a schematic diagram of a distributed power combiner in accordance with the invention.

As shown in FIG. 2, the distributed power combiner of the invention is structurally identical to the divider, except that the inputs and outputs are reversed, as are the inputs and outputs of the active devices. The same reference numerals are used, but with primes added to indicate the function of power combining. Thus, the power combiner of the invention includes an output transmission line 10' and N input transmission line 12'. The output transmission line 10' includes a plurality of series-connected impedances 14', each of which has an impedance value Z. The input transmission lines 12' are each shown as having three series-connected impedances 20' and a terminating impedance 22' of value $R_0$. Each input transmission line 12' has associated with it two active devices 18' in the form of FETs, the drain terminal of each FET being connected to the junction between two adjacent impedances 20, and the gate terminal being connected to the junction between two impedances 14' in the output transmission line 10'.

Although the impedances 14, 14', 20 and 20' are shown as each constituting a single and identical impedance value Z, in fact they are fabricated as small inductances, which, when interconnected with the active devices, form the characteristic impedance with the internal capacitances of the active devices. In some configurations, the Z values may have to be unequal to produce a transmission line 10 or 12 having the desired characteristic impedance. Specifically, in case of the power divider the input transmission line is formed by the impedances 14 and the gate-source capacitances of the FETs 18. On the output line side of the divider, the output transmission lines 13 are formed by the impedances 20 and the drain-source capacitances of the FETs 18.

Each transmission line of the divider or combiner functions basically as a low-pass filter with a very wide frequency pass-band. Therefore, the entire device operates over a wide band of frequencies with practically negligible losses. Another advantage of the invention is that one or more of the divider outputs or combiner inputs can be selectively disabled without affecting the other inputs or outputs. For example, one or more of the divider outputs can be switched off, if desired, without affecting the other outputs. Such switching could be effected, for example, by biasing all of the FETs 18 associated with a selected output to an "off" condition, using a second gate terminal in each FET. No output signal would be generated in the corresponding output transmission line, but this would have virtually no effect on the input transmission line and on the other output transmission lines. Alternatively, switching of outputs could be performed at the point of output from the divider. Similar considerations apply to the combiner configuration.

It will be appreciated from the foregoing that the present invention represents a significant advance in the field of power combiners and dividers for use at radio frequencies. In particular, the invention provides a power combiner or divider operable with net gain rather than with substantial losses, operable over a wide frequency band, and having the advantages of fabrication in a small and lightweight form as microwave integrated circuits or monolithic microwave integrated circuits. It will also be appreciated that, although two embodiments of the invention have been described in detail for purposes of illustration, various modifications may be made without departing from the spirit and scope of the invention. Accordingly, the invention is not to be limited except as by the appended claims.

We claim:

1. A distributed power divider, comprising:
    an input transmission line having a plurality (N) of groupings of series-connected impedances, an input terminal at one end of the line, and a terminating impedance connected between the other end of the line and ground;
    a plurality of active devices associated with each of said groupings, each active device having an input terminal and an output terminal, the input terminals of the active devices being connected serially to junction points between impedances of the associated groupings in the input transmission line; and
    a plurality (N) of output transmission lines associated with said groupings, where N is the divide ratio of the power divider, each output transmission line having a plurality of series-connected impedances, one end providing an output terminal, the other end being connected to ground through a terminating impedance, and the output terminals of a plurality of the active devices being connected to junctions between the impedances in the output transmission line.

2. A distributed power divider as defined in claim 1, wherein:
    impedances in the input transmission line and in the output transmission lines function in combination with internal capacitances of the active devices to produce a desired characteristic transmission line impedance.

3. A distributed power divider as defined in claim 1, wherein:
    the active devices are field-effect transistors, each having a gate terminal, a source terminal and a drain terminal;
    the gate terminals of the field-effect transistor are connected to junctions between impedances in the input transmission line;
    the drain terminals of the field-effect transistors are connected to junctions between the impedances in the output transmission lines; and
    the source terminals of the field-effect transistors are grounded.

4. A distributed power divider as defined in claim 3, wherein:
    impedances in the input transmission line and in the output transmission lines function in combination with internal capacitances of the active devices to produce a desired characteristic transmission line impedance.

5. A distributed power combiner, comprising:
    an output transmission line having a plurality (N) of groupings of series-connected impedances, an output terminal at one end of the line, and a terminating impedance connected between the other end of the line and ground;
    a plurality of active devices associated with each of said groupings, each active device having an input terminal and an output terminal, the output terminals of the active devices being connected serially to junction points between impedances of the associated groupings in the output transmission line; and
    a plurality (N) of input transmission lines associated with said groupings, where N is the divide ratio of the power combiner, each input transmission line having a plurality of series-connected impedances, one end providing an input terminal, the other end being connected to ground through a terminating impedance, and the input terminals of a plurality of the active devices being connected to junctions between the impedances in the input transmission line.

6. A distributed power combiner as defined in claim 5, wherein:
    impedances in the input transmission lines and in the output transmission line function in combination with internal capacitances of the active devices to produce a desired characteristic transmission line impedance.

7. A distributed power combiner as defined in claim 5, wherein:
    the active devices are field-effect transistors, each having a gate terminal, a source terminal and a drain terminal;
    the gate terminals of the field-effect transistors are connected to junctions between impedances in the input transmission lines;
    the drain terminals of the field-effect transistors are connected to junctions between the impedances in the output transmission line; and
    the source terminals of the field-effect transistors are grounded.

8. A distributed power combiner as defined in claim 7, wherein:
    impedances in the input transmission lines and in the output transmission line function in combination with internal capacitances of the active devices to produce a desired characteristic transmission line impedance.

* * * * *